(12) United States Patent
Hee et al.

(10) Patent No.: US 9,627,213 B2
(45) Date of Patent: Apr. 18, 2017

(54) METHOD OF FABRICATING A TUNNEL OXIDE LAYER AND A TUNNEL OXIDE LAYER FOR A SEMICONDUCTOR DEVICE

(75) Inventors: Eng Gek Hee, Kuching (MY); Ka Siong Wisley Ung, Kuching (MY)

(73) Assignee: X-FAB SEMICONDUCTOR FOUNDRIES AG, Erfurt (DE)

(*) Notice: Subject to any disclaimer, the term of this patent is extended or adjusted under 35 U.S.C. 154(b) by 0 days.

(21) Appl. No.: 14/390,431

(22) PCT Filed: Apr. 5, 2012

(86) PCT No.: PCT/EP2012/056314
§ 371 (c)(1),
(2), (4) Date: Oct. 3, 2014

(87) PCT Pub. No.: WO2013/149669
PCT Pub. Date: Oct. 10, 2013

(65) Prior Publication Data
US 2015/0108559 A1    Apr. 23, 2015

(51) Int. Cl.
| | |
|---|---|
| H01L 21/28 | (2006.01) |
| H01L 29/66 | (2006.01) |
| H01L 29/78 | (2006.01) |
| H01L 29/788 | (2006.01) |
| H01L 27/11517 | (2017.01) |

(52) U.S. Cl.
CPC .. *H01L 21/28273* (2013.01); *H01L 27/11517* (2013.01); *H01L 29/66825* (2013.01); *H01L 29/788* (2013.01); *H01L 29/7881* (2013.01)

(58) Field of Classification Search
CPC ......... H01L 21/28273; H01L 27/11517; H01L 29/788; H01L 29/66825; H01L 21/28; H01L 29/66; H01L 29/78; H01L 29/7881
See application file for complete search history.

(56) References Cited

U.S. PATENT DOCUMENTS

| | | | | |
|---|---|---|---|---|
| 5,559,351 | A | * | 9/1996 | Takiyama ......... H01L 21/28185 257/324 |
| 6,133,605 | A | * | 10/2000 | Kishi ................ H01L 21/28202 257/324 |
| 6,674,138 | B1 | | 1/2004 | Halliyal et al. |
| 7,071,538 | B1 | | 7/2006 | Shiraiwa et al. |
| 7,115,469 | B1 | * | 10/2006 | Halliyal et al. ............... 438/257 |
| 7,387,972 | B2 | * | 6/2008 | Dong et al. ................... 438/769 |
| 2003/0155582 | A1 | * | 8/2003 | Mahajani et al. ............ 257/200 |
| 2004/0166632 | A1 | * | 8/2004 | Jeng et al. .................... 438/261 |

(Continued)

OTHER PUBLICATIONS

International Search Report for corresponding application PCT/EP2012/056314 filed Apr. 5, 2012: Mail date Jan. 7, 2013.

(Continued)

*Primary Examiner* — Fazli Erdem
(74) *Attorney, Agent, or Firm* — Nixon & Vanderhye PC (57) ABSTRACT

A method of fabricating a tunnel oxide layer for a semiconductor memory device, the method comprising: fabricating on a substrate a first oxide layer by an in-situ-steam-generation process; and fabricating at least one further oxide layer by a furnace oxidation process, wherein during fabrication of the at least one further oxide layer, reactive gases penetrate the first oxide layer and react with the silicon substrate to form at least a first portion of the at least one further oxide layer beneath the first oxide layer.

22 Claims, 10 Drawing Sheets

(56) References Cited

U.S. PATENT DOCUMENTS

| | | | |
|---|---|---|---|
| 2005/0082625 A1* | 4/2005 | Kim | H01L 21/28088 257/412 |
| 2005/0090062 A1 | 4/2005 | Wang | |
| 2008/0048249 A1* | 2/2008 | Tega et al. | 257/326 |
| 2008/0079056 A1* | 4/2008 | Cha et al. | 257/314 |
| 2008/0293255 A1* | 11/2008 | Ramkumar | 438/770 |
| 2008/0296658 A1* | 12/2008 | Maurelli | 257/321 |
| 2008/0318382 A1* | 12/2008 | Dai | H01L 21/28273 438/264 |
| 2009/0142899 A1* | 6/2009 | Jensen | H01L 21/28079 438/287 |
| 2009/0227116 A1* | 9/2009 | Joo | H01L 21/28282 438/763 |
| 2012/0156891 A1* | 6/2012 | Lin et al. | 438/773 |
| 2013/0307052 A1* | 11/2013 | Jenne et al. | 257/325 |
| 2013/0307053 A1* | 11/2013 | Polishchuk et al. | 257/325 |
| 2013/0309826 A1* | 11/2013 | Ramkumar et al. | 438/269 |

OTHER PUBLICATIONS

Written Opinion for corresponding application PCT/EP2012/056314 filed Apr. 5, 2012: Mail date Jan. 7, 2013.
Andrea Chimenton et al., "Impact of Tunnel Oxide Thickness on Erratic Erase in Flash Memories," Sep. 24, 2002, pp. 363-366.

\* cited by examiner

Fig 6    Long Channel 10 x 10 Threshold Voltage for 3.3V NMOS & PMOS.

Fig 7    Short Channel 10 x 0.18 Threshold Voltage for 1.8V NMOS & PMOS

Fig 8  Short Channel 10 x 0.35/0.30 Threshold Voltage for 3.3V NMOS & PMOS

Fig 9  Short Channel 0.18μm Saturation Current for 1.8V NMOS & PMOS

Fig 10  Short Channel 0.35μm/0.30μm Saturation Current for 3.3V NMOS & PMOS

Fig 11    Short Channel 0.18μm Drain-Source Breakdown for 1.8V NMOS & PMOS

Fig 12    Short Channel 0.18μm Drain-Source Breakdown for 3.3V NMOS & PMOS

METHOD OF FABRICATING A TUNNEL OXIDE LAYER AND A TUNNEL OXIDE LAYER FOR A SEMICONDUCTOR DEVICE

FIELD OF THE INVENTION

The present invention relates to a method of fabricating a tunnel oxide layer for semiconductor memory devices and to a tunnel oxide layer for a semiconductor memory device.

BACKGROUND

A tunnel oxide layer is a layer of high quality oxide which insulates a gate of a semiconductor device, such as a floating gate, from an underlying silicon substrate. A tunnel oxide layer may, for example, be used in a semiconductor memory device, such as a non-volatile memory.

One of the challenges of improving non-volatile memories is improving the data retention characteristics of the memories without having to change the core logic devices in such a way that high speed logic performance is compromised. Optimizing the properties of the tunnel oxide layer is a way to optimize the retention characteristics of the memory.

U.S. Pat. No. 7,115,469 describes a process for fabrication of a semiconductor device including an ONO structure as a component of a flash memory device. U.S. Pat. No. 7,071,538 describes a semiconductor device including a substrate that further includes source, drain and channel regions. US 2005/0090062 describes a method for forming a nitrided tunnel oxide layer.

SUMMARY OF INVENTION

According to the invention in a first aspect, there is provided a method of fabricating a tunnel oxide layer for a semiconductor memory device, the method comprising: fabricating on a substrate a first oxide layer by an in-situ-steam-generation process; and fabricating at least one further oxide layer by a furnace oxidation process, wherein during fabrication of the at least one further oxide layer, reactive gases penetrate the first oxide layer and react with the silicon substrate to form at least a first portion of the at least one further oxide layer beneath the first oxide layer.

Optionally, fabricating the first oxide layer results in the first oxide layer having a thickness in the range from 25 Å to 35 Å.

Optionally, the duration of the in-situ-steam-generation process is in the range from 30 seconds to 45 seconds.

Optionally, the duration of the in-situ-steam-generation process is in the range from 35 seconds to 40 seconds.

Optionally, the temperature of the in-situ-steam-generation process is in the range from 900 degrees Celsius to 1000 degrees Celsius.

Optionally, a second portion of the at least one further oxide layer is fabricated adjacent to the first oxide layer.

Optionally, the thickness of the second portion of the at least one further oxide layer fabricated next to the first oxide layer is in the range from 25 Å to 35 Å.

Optionally, the in-situ-steam-generation process uses an oxygen gas flow in the range from $8.18*10^{-5}$ m$^3$/s to $8.35*10^{-5}$ m$^3$/s per silicon wafer.

Optionally, the in-situ-steam-generation process uses a hydrogen gas flow in the range from $0.0167*10^{-5}$ m$^3$/s to $0.167*10^{-5}$ m$^3$/s per silicon wafer.

Optionally, the pressure applied during the in-situ-steam-generation process is in the range from 1200 Pa to 1333 Pa.

Optionally, a second portion of the at least one further oxide layer is fabricated on the substrate adjacent to the first oxide layer.

Optionally, fabricating the at least one further oxide layer comprises fabricating first and second further oxide layers, each fabricated by a furnace oxidation process, wherein a first portion of the second further oxide layer is formed beneath the first oxide layer.

Optionally, the combined thickness of the first oxide layer and first and second further oxide layers is in the range from 68 Å to 80 Å.

Optionally, a second portion of the second further oxide layer is formed beneath the second portion of the first further oxide layer fabricated adjacent to the first oxide layer, wherein during fabrication of the second portion of the second further oxide layer, reactive gases penetrate the second portion of the first further oxide layer and react with the silicon substrate to form the second portion of the second further oxide layer beneath the second portion of the first further oxide layer.

Optionally, a third portion of the second further oxide layer is formed on the substrate adjacent to the second portion of the second further oxide layer.

Optionally, the method further comprises, after the fabrication of said first oxide layer and first further oxide layer and before the fabrication of said second further oxide layer: covering at least a portion of the first oxide layer and a portion of the first further oxide layer with a mask; wet cleaning to remove from the substrate the portion of the first oxide layer and/or first further oxide layer not covered by the mask; and removing the mask.

Optionally, said first, and at least one further oxide layers are formed without use of plasma nitridation.

Optionally, the semiconductor memory device is a single poly floating gate erasable programmable read only memory.

Optionally, the semiconductor memory device is a single poly floating gate electrically erasable programmable read-only memory.

According to the invention in a second aspect, there is provided a tunnel oxide layer for a semiconductor memory device fabricated according to the method described above.

According to the invention in a third aspect, there is provided a semiconductor device comprising the tunnel oxide layer described above.

According to the invention in a fourth aspect, there is provided a tunnel oxide layer for a semiconductor memory device comprising an in situ-steam generation oxide layer positioned on top of at least one furnace oxidation oxide layer, wherein the first oxide layer and the at least one further oxide layer are stacked.

FIGURES

Exemplary embodiments of the invention will now be described with reference to the following figures.

DESCRIPTION

Semiconductor devices are preferably fabricated with a small thermal budget influence. As used herein, the term "thermal budget" encompasses the total amount of thermal energy transferred to the device during an elevated temperature fabrication process during device fabrication. The thermal budget is proportional to the temperature and the duration of the elevated temperature fabrication process. A low thermal budget is preferable as this helps prevent dopant re-distribution within doped semiconductor regions of the device. When a high temperature is required for the fabrication process, the thermal budget can be kept low by keeping the duration of the fabrication process to a minimum. A process in which the duration of high temperature exposure is kept short is referred to as rapid thermal processing (RTP).

Figure 1:
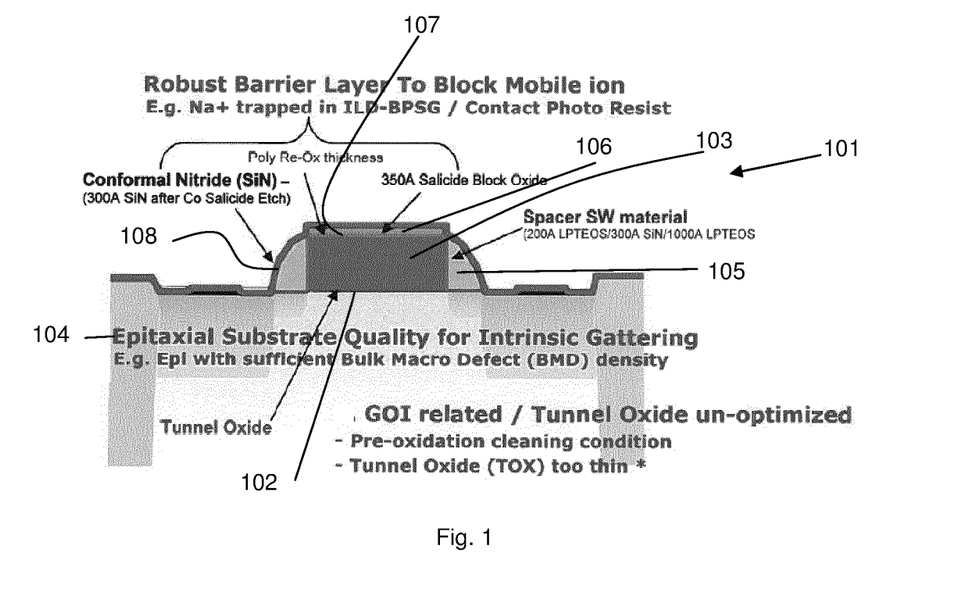
FIG. 1 shows a cross section of a semiconductor device.

FIG. 1 shows a vertical cross section through an exemplary semiconductor device 101 in which three factors influencing the performance of the device are indicated. These three factors are discussed in more detail below.

The device 101 has a tunnel oxide layer 102, which separates a gate 103 from a substrate 104. A spacer material 105 is provided laterally around the gate 103. A salicide block oxide layer 106 and a poly re-oxidation layer 107 are provided on top of the gate and the device is covered in a silicon nitride layer 108.

There are multiple factors which may influence the data retention behaviour of an electron tunnel oxide (ETOX) memory Floating Gate, either for a UV erasable programmable read only memory (EPROM), one-time programmable (OTP) or electrically erasable programmable read-only memory (EEPROM).

As a first factor, the use of a P/P+epitaxial substrate 104 doped with boron may enhance the formation of oxygen precipitate to reduce bulk micro defect (BMD) density, resulting in better intrinsic gettering free of crystal originated pits (COP), whereby the potential risk of crystal grown defects is reduced or eliminated, except for unavoidable epitaxial defects such as stacking faults. Defects may cause weak bits, which are bits of memory that allow only a small number of data writes without fault when compared to other bits of the memory. Normally, epitaxial substrate defect induced non-volatile memory (NVM) weak bits are supposed to be identified in functional probing test procedures by baking at 250° C. for twenty-four hours. These defects would not become a reliability failure in perfect screening methodology. Uniform BMD distribution within a wafer results in better intrinsic gettering efficiency especially in the wafer edge region.

As a second factor, the inventors have appreciated that the gate oxide (tunnel oxide) performance very much depends on the uniformity of the tunnel oxide thickness and the quality of the oxide used in the tunnel oxide layer. The silicon surface preparation prior to the tunnel oxide layer fabrication is critical to achieving a smooth silicon-oxide interface. A smooth interface between the silicon and tunnel oxide will reduce the number of oxide charges trapped in the interface. Trapped oxide charges are associated with defects in the grown tunnel oxide layer, and may potentially lead to EPROM tunnel oxide (ETOX) data retention failure. In a conventional Radio Corporation of America (RCA) cleaning process used prior to gate oxidation, silicon surface roughening has been found to occur as a result of using $NH_4OH$: $H_2O_2$:$H_2O$ in the ratio of 1:1:5. Excessive amounts of ammonium hydroxide may lead to etching of silicon and may also lead to micro-roughening. Micro-roughening may have detrimental effects on the quality and breakdown voltage characteristics of thin, thermally grown gate oxide films. A reduction of the $NH_4OH$ concentration in the 1:1:5 SC-1 (where SC stands for standard clean) mixtures down to 0.1:1:5 or 0.01:1:5 may not only eliminate roughening, but may also enhance the removal of particles. A good compromise mixture in terms of particle removal efficiency and avoidance of micro-roughening of the silicon would be a volume ratio of 0.25:1:5. Hence, a pre-tunnel oxide growing cleaning recipe with more diluted SC-1 (1:4:50), and a SC-2 (1:4:20) mixing ratio with a higher temperature (such as 45° C.) may be better when compared to a conventional SC-1 SC-2 mixing ratio (1:1:5) at a 30° C. condition.

As a third factor, plasma chemical vapour deposition (CVD) using tetra-ethoxy-silane (P-TEOS) has a better step coverage property and thereby ensures filling of a gap between the first metal lines without the formation of voids. Further, the degree of surface topology planarization obtained from P-TEOS is better in the context of uniformity. This enables scaling of the memory device or shrinkage of the memory design rule.

However, such dielectric layers with good step coverage usually absorb a large amount of water-related species in inter-metal dielectric (IMD) layers, which water-related species can diffuse to a borophospho-silicate glass (BPSG) layer and have adverse effects on the reliability of floating-gate devices. The water-related species can accelerate the memory cell charge loss and also a hot-carrier-induced degradation of peripheral N-channel MOSFETs during the high temperature bake. This is because the water-related species (mobile ions) pass through the BPSG layer and react with the weak bonds in the gate oxide to form water-related traps. In other words, the mobile ionic charges are due to sodium ($Na^+$) or other alkali ions that get into the oxide during the cleaning and fabrication processes of a floating gate device. Device instabilities from mobile ions could be minimized by avoiding contamination during processing. The most common approach to counter the action of alkali ions is by gettering them far from the interface in a gettering medium or water-blocking layer. An example of a water-blocking layer is a conventional silane-based plasma CVD $SiO_2$ (P—$SiO_2$), which may be used for the 350 Å Salicide Block Oxide (SAB) layer 106, as indicated in FIG. 1. The floating gate of memory devices are encapsulated by the SAB layer. Nevertheless, this is still not effective enough to prevent water diffusion toward the tunnel oxide. In principle, the water diffusion may be prevented by a large increase of the SAB oxide film thickness, for example 1600 Å. However, an increase to this thickness is not feasible due to induction of field oxide loss resulting from a thicker SAB plasma dry etch. An alternative countermeasure would be the formation of a 300 Å SiN contact stopper layer 108, which may be able to enhance the floating gate data retention characteristics. Other factors, such as the spacer scheme with an ONO stack, are unlikely to be a data retention risk factor, because of a potential carbon-rich residue of hardened photo resist after NP and PP implantations.

Any hardened photo resist residue remaining after NP and PP implantation can easily be removed by a short period, for example 2 seconds, of dipping in dilute hydrofluoric add (HF dipping), followed by, for example, 600 seconds of sulfuric-peroxide mixture (SPM) or Peroxymonosulfuric acid (CARO's acid) cleaning and, for example, 300 seconds of SC-1 cleaning.

Beyond that, control of many process factors such as the amount of water contained before the passivation film deposition, the refractive index and water permeability of the passivation film and the thermal budget after passivation film deposition are factors for enhancing the reliability of the NVM. Typically, plasma silicon nitride (P—SiN) and plasma silicon oxynitride (P—SiON) have been widely used as a top passivation film due to their properties as excellent barriers to water penetration, and tunnel oxide degradation strongly depends on the refractive index of the P—SiN or P—SiON passivation film. P—SiON passivation films are films with a higher refractive index (because of higher nitrogen content) and therefore lead to higher tunnel oxide degradation caused by water-related electron traps.

Herein disclosed is a method for fabricating a tunnel oxide layer with low thermal budget radical oxidation. The tunnel oxide layer may be used in a single poly-floating gate NVM. The inventors have appreciated that the thickness of the tunnel oxide layer is a factor contributing to data retention characteristics of an NVM. A thicker tunnel oxide may achieve better data retention characteristics without requiring modification of the core logic devices in triple gate integration. As no further modification of the NVM device besides the modification of the oxide layers is required, high speed logic performance may be maintained. The fabrication of the tunnel oxide layer may be achieved using an in-situ steam generation (ISSG) process for fabricating a first gate oxidation layer before oxidation of the logic gates. Preferably, no nitrogen plasma nitridation process is used.

In this disclosure, the inventors appreciate how thicker oxides could minimize initial and latent oxide defects, and how minimizing oxide defects could improve oxide integrity and yield. The lower voltages used for the functions of erasing and programming the end device, combined with the relatively thicker oxides together reduce the endurance related extrinsic data retention failure rate for EEPROM.

In general, increasing the thickness of the tunnel oxide layer may lead to anomalous charge leakage, caused by one or two defects in the oxide especially for high density NVM application in UV-EPROM or an EEPROM.

An optimum thickness of a thick oxide layer (TOx) may improve the data retention characteristic. The inventors have appreciated that dedicated thicker TOx grown with ISSG can be used in a memory device to improve the data retention properties of the Floating Gate memory. The improvement may be achieved without jeopardizing other characteristics of primitive 1.8V and 3.3V gate oxide integration.

A device with TOx fabricated according to the method described herein is explained with reference to FIG. 2. This figure shows a cross-section of a single poly UV-EPROM array in a triple gate integration. That is, in the exemplary UV-EPROM array of FIG. 2, a composite of three oxide layers forms the tunnel oxide for the non-volatile memory transistor gates.

A thicker tunnel oxide 201 for the single poly floating gate (FG) is created in this arrangement. Further, a select gate (SG) 202 is created by ISSG radical oxidation with logic gates furnace oxidation. The thermal budget influence from the ISSG process on the rest of the device is negligible.

Figure 2:
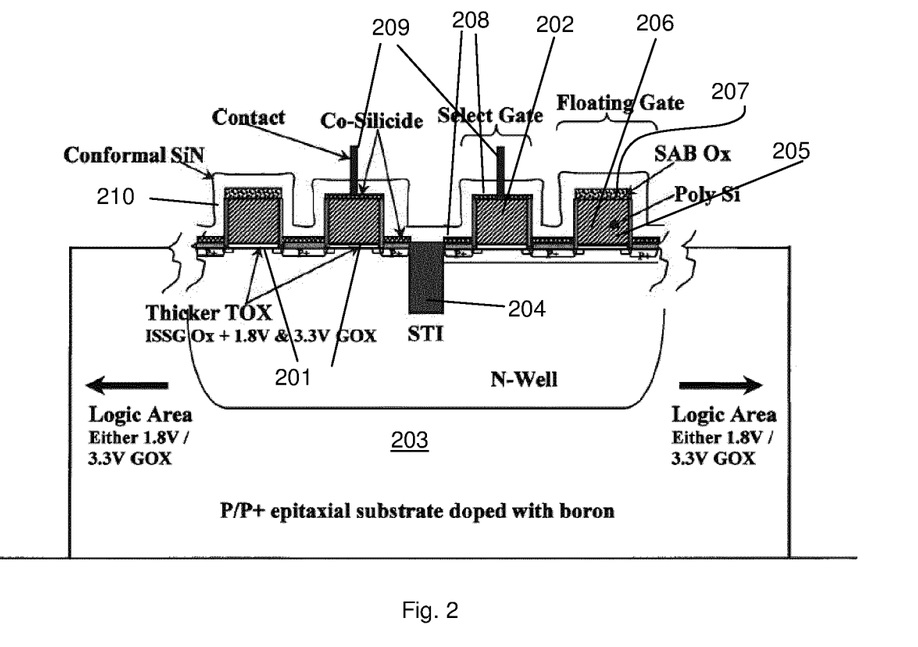
FIG. 2 illustrates a semiconductor device including thick oxide layers.

As shown in FIG. 2, the thick oxide layer 201 separates and insulates the gates from the epitaxial substrate doped with boron 203. A shallow trench isolation 204 is provided between gates. The gates comprise a poly-silicon layer 205. A floating gate 206 is shown next to select gate 202. The floating gate 206 has a SAB oxide layer 207 provided above the poly-silicon layer 205. A co-silicide layer 208 is provided between gates and above the poly-silicon layer of the select gate. A contact 209 is attached to the select gate 202. A layer of conformal SiN 210 covers the gates.

High density single poly non-volatile memory transistors fabricated according to the method described below are fully compatible with CMOS processes.

Figure 3A:
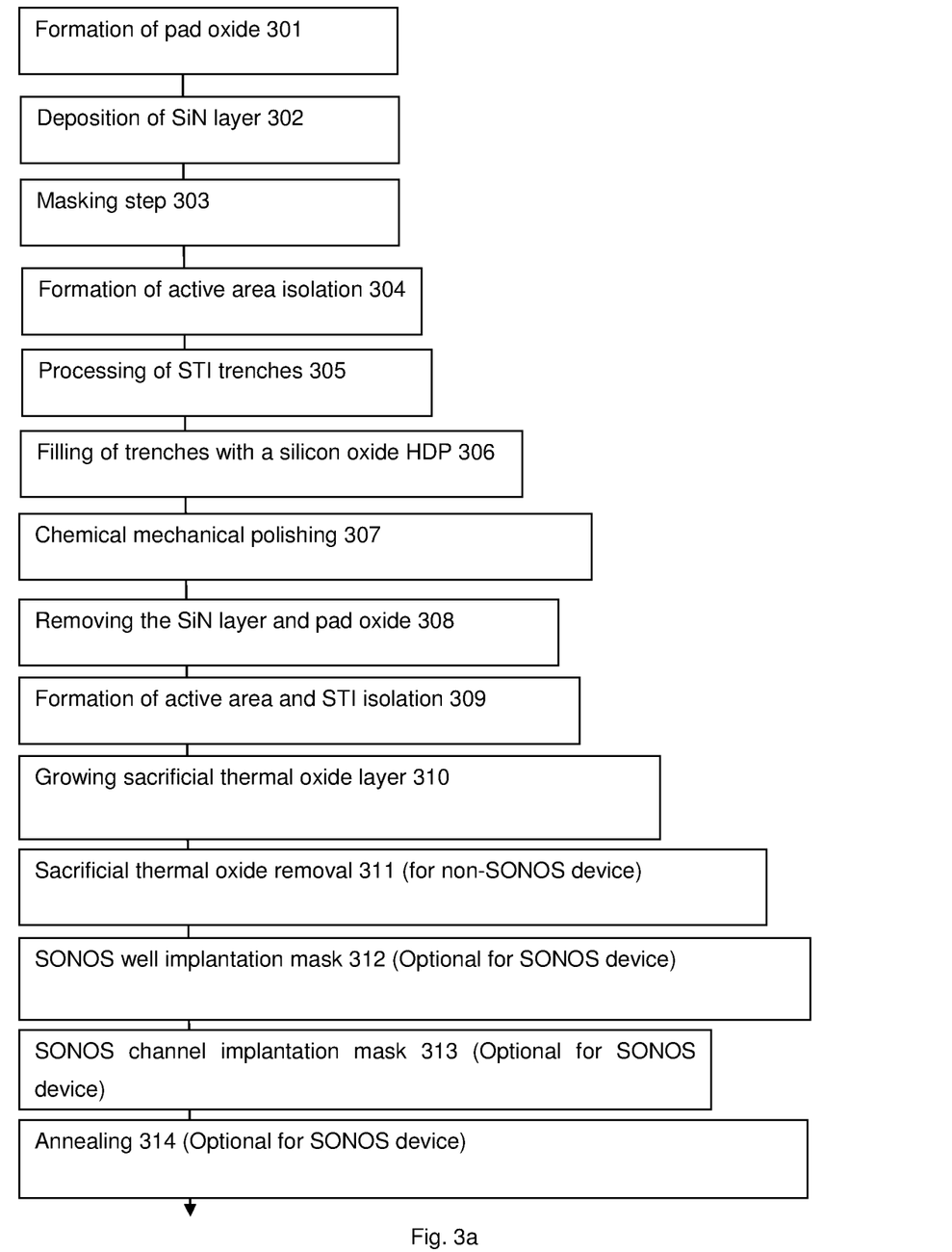
FIG. 3a shows a method of fabricating a semiconductor device.
Figure 3B:
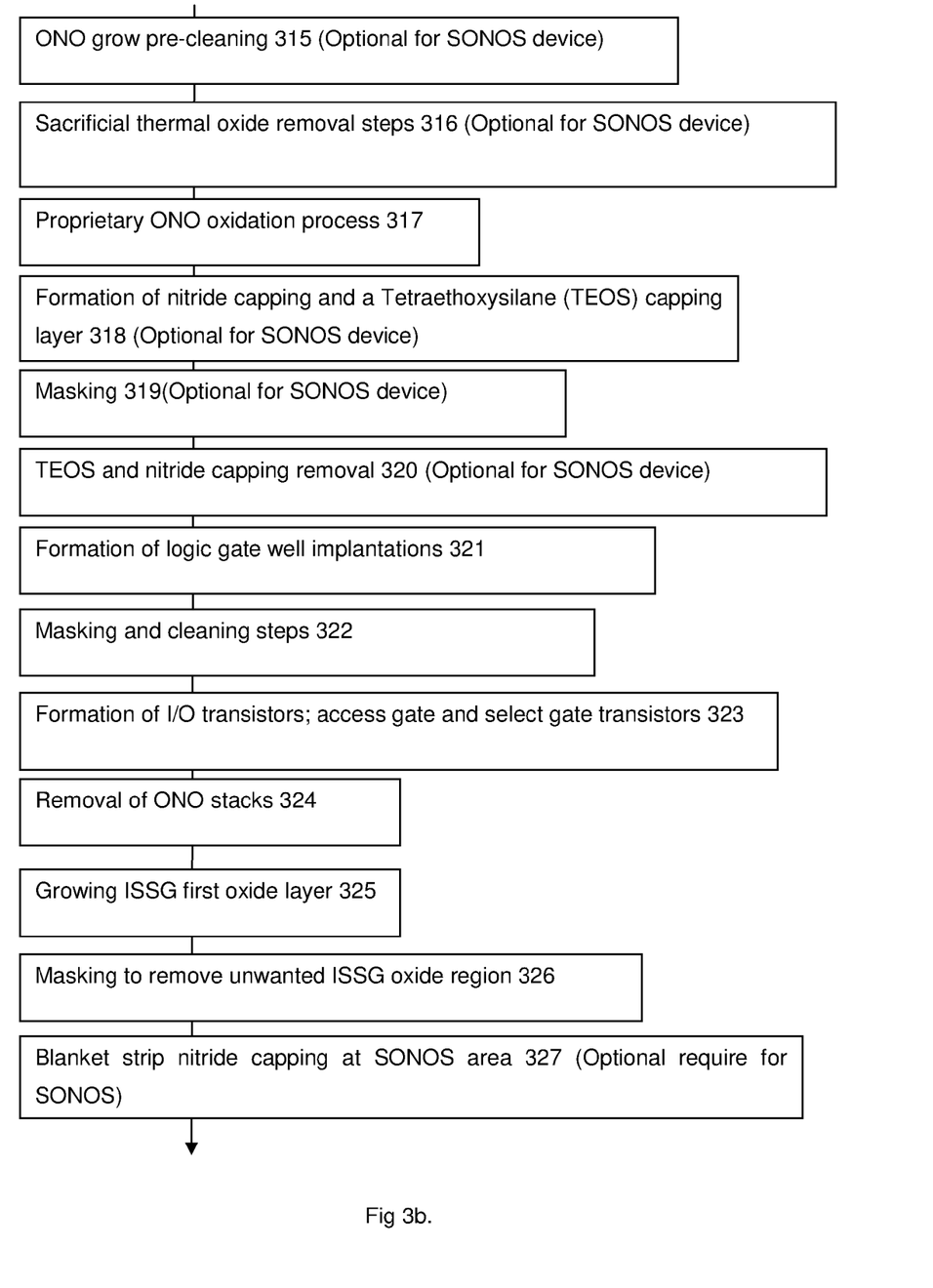
FIG. 3b shows a method of fabricating a semiconductor device.
Figure 3C:
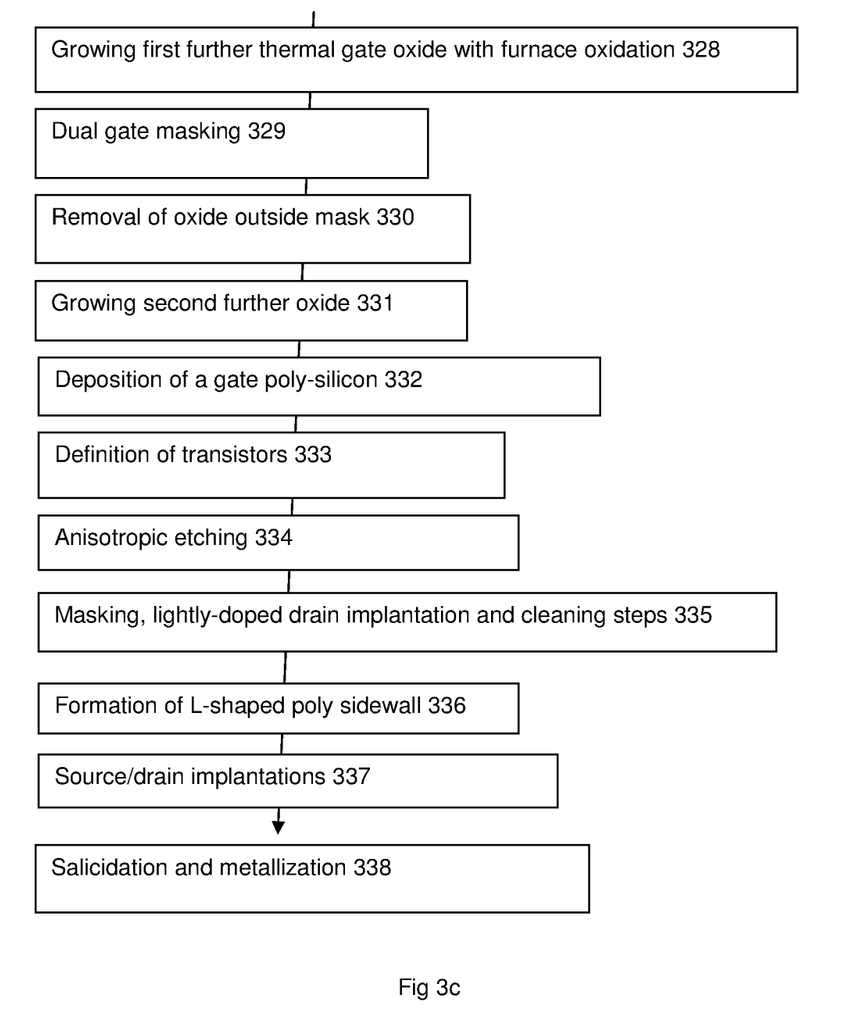
FIG. 3c shows a method of fabricating a semiconductor device.

FIGS. 3a to 3c illustrate method steps for fabricating a semiconductor memory device. First, a pad oxide for the NVM cell is formed 301 on a silicon substrate, and a SiN layer is deposited 302 on top of the pad oxide. The pad oxide is a stress relief layer for the SiN layer.

An active area of an NVM device is then defined by a masking step 303 wherein a mask is applied to the SiN layer leaving the active area unmasked.

Active area isolation is formed 304 by anisotropic etching of the SiN layer, the pad oxide and a certain depth of the wafer substrate, thereby forming shallow trench isolation (STI) trenches.

The STI trenches are processed 305 by the application of a trench liner oxide, a thin, high-quality thermal oxide grown in the trenches, prior to being filled with a high density plasma (HDP) silicon oxide 306 insulating material.

STI chemical mechanical polishing (CMP) is used 307 to polish away unwanted silicon oxide above the SiN layer covering the active area. Subsequently, the SiN layer and pad oxide are removed 308. The active area and STI isolation are now formed 309.

A sacrificial thermal oxide layer is now grown 310. For the manufacture of memory cells that are not silicon-oxide-nitride-oxide-silicon (SONOS) devices, the sacrificial thermal oxide layer is then removed 311. In an alternative embodiment, it would be possible to omit steps 310 and 311.

For the manufacture of SONOS devices, the sacrificial thermal oxide layer is not removed, but its formation is followed by SONOS cell formation masking comprising the following steps: formation of a SONOS well implantation mask 312; formation of a SONOS channel implantation mask 313 for SONOS threshold voltage optimization; an annealing step 314; an ONO grow pre-cleaning step 315; a sacrificial thermal oxide removal step 316; a proprietary ONO oxidation process 317 followed by formation of a nitride capping and a Tetraethoxysilane (TEOS) capping layer 318 to protect the SONOS area; masking 319 for TEOS; and nitride capping removal 320 of non-SONOS areas. It is noted that method steps 312-316 and 318-320 are optional and are normally only carried out for the fabrication of SONOS devices. For the fabrication of other device types, these steps may be omitted.

At step 321 all the necessary logic gate well implantations are formed by way of an oxide multilayer (ONO) stack. This is followed by various implantation masking 322 and cleaning steps as is done in conventional CMOS logic processes. The I/O transistors, access gate and select gate transistors are formed 323. The ONO stacks are then removed 324 by wet clean of buffer HF dipping and hot phosphoric acid stripping followed by buffer HF dipping.

In conventional CMOS logic well implantation techniques, implantation is through a single layer thermal screen oxide. In contrast, the above method uses an ONO stack as a unique process integration, which allows sharing the same ONO film stack for SONOS integration. Such process design eliminates the need for an extra thermal oxide growth step and avoids the inclusion of additional thermal budget. In a further elaboration of the above method steps the ONO stack may be used as a screen oxide for all the necessary logic gate well implantations.

Figure 4:
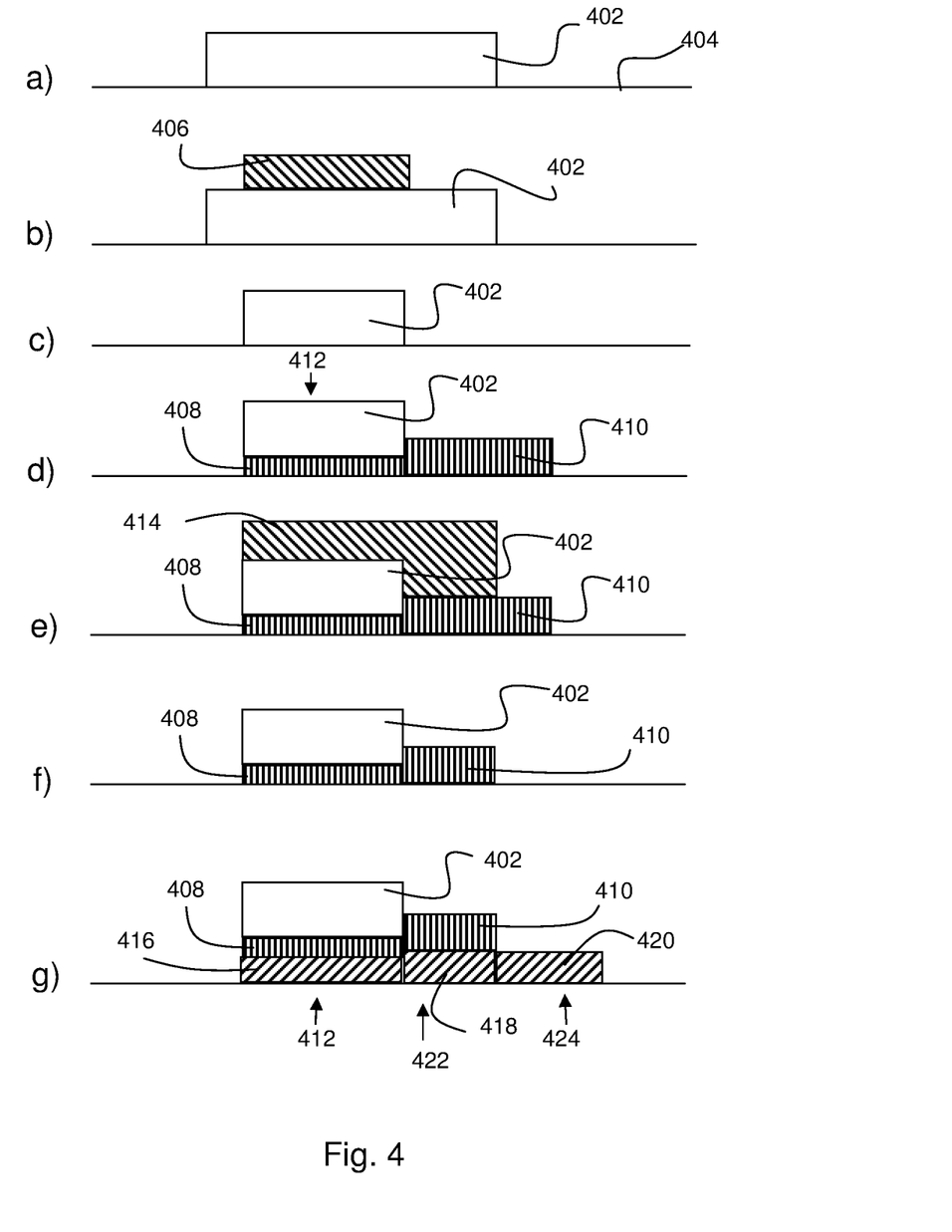
FIG. 4 illustrates the fabrication steps of an oxide layer.

An in situ-steam generation (ISSG) process is used to fabricate 325 a first oxide layer on a substrate. FIG. 4a illustrates the first oxide layer 402 deposited on a substrate 404. The substrate 404 may comprise silicon. A "CEL" mask is applied 326 to define a cell area or memory array area defined for floating gate and select gate regions. The CEL mask covers the first oxide layer 402 over a desired oxide layer area. The CEL mask protects the ISSG first oxide layer 402 grown at a single poly cell area (UV-EPROM and EEPROM) when removing the unwanted ISSG oxide by HF dipping. FIG. 4b illustrates a mask 406 covering at least part of the first oxide layer 402 and protecting the portion of the first oxide 402 covering the single poly cell area. After HF dipping the desired area of first oxide layer 402 remains as illustrated in FIG. 4c.

For the fabrication of SONOS devices, hot phosphoric acid is used to blanket strip 327 away a nitride capping layer at the SONOS area. This step is normally only carried out for the fabrication of SONOS devices.

ISSG oxidation has an insignificant thermal budget influence on the logic gates well implantation formed earlier.

The ISSG oxidation oxide layer fabrication process results in a first oxide layer 402 with a thickness in the range from 25 Å to 35 Å, preferably around 30 Å.

After removal of the CEL mask, at least one further oxide layer is fabricated 328 by a furnace oxidation process. During fabrication of the at least one further oxide layer, reactive gases penetrate the first oxide layer and react with the silicon substrate to form at least part of the at least one further oxide layer beneath the first oxide layer. In the specific example described in FIGS. 3 and 4, two further oxide layers are fabricated.

FIG. 4d illustrates at least a first portion 408 of the first further oxide layer formed beneath the first oxide layer 402. This occurs because the reactive gases used during the furnace oxidation process penetrate through the first oxide layer 402 and react with the substrate 404 to fabricate the first portion 408 of the first further oxide layer on the surface of the substrate 404. A second portion 410 of the first further oxide layer is fabricated adjacent to the first oxide layer 402. In specific exemplary methods, the reactive gases used in the furnace oxidation process may be hydrogen and oxygen gases.

A thicker combined tunnel oxide stack 412 is thereby formed by the combination of the first oxide layer 402 fabricated by ISSG and the first portion 408 of the first further oxide layer fabricated by furnace oxidation. The first portion 408 of the first further oxide layer pushes the ISSG oxide layer upward during the furnace oxidation process, thereby retaining the first oxide layer 402 as the top surface of the tunnel oxide.

The combined thickness of the first oxide layer 402 and the first portion 408 of the first further oxide layer is in the range from 50 Å to 70 Å, preferably around 60 Å. The thickness of the oxide layer 410 may be in the range from 40 Å to 60 Å, preferably 50 Å.

The thickness of the first portion 408 of the first further oxide layer fabricated beneath the first oxide layer 402 is different from the thickness of the second portion 410 as a result of oxidation kinetics. In particular, the first portion 408 would normally be expected to be thinner than the second portion 410.

In exemplary tunnel oxides, the second portion 410 of the first further oxide layer may be in the range from 25 Å to 35 Å. In a specific exemplary tunnel oxide, the second portion 410 of the first further oxide layer may be preferably around 30 Å.

A dual gate mask 414 is used 329 to cover the envisaged first and second gate oxide regions. The excess regions of the first oxide layer 402 and first further oxide layer are removed 330 from the regions of the substrate not covered by the mask 414. This allows a second further oxide layer to be fabricated in that region on the substrate, i.e. the region not covered by the mask 414. The removal of the excess regions of the first oxide layer 402 and the first further oxide layer may be undertaken by wet clean. The mask is then removed. The mask 414 is shown in FIG. 4e. The resulting oxide layers after removal of the excess regions and the mask 414 is shown in FIG. 4f.

A second further oxide layer is now fabricated 331 using furnace oxidation to define the final gate oxide layers in three gate oxide regions as illustrated in FIG. 4g. As with the first further oxide layer, reactive gases used during the second furnace oxidation process 331 penetrate the first oxide layer 402 and the first furnace oxidation oxide layer.

A first portion 416 of the second further oxide layer is fabricated beneath the first portion 408 of the first further oxide layer. As with the first further oxide layer, the second further oxide layer 416 pushes the first oxide layer 402 (and the first further oxide layer 408) upwards during the furnace oxidation process. In addition, a second portion 418 of the second further oxide layer is fabricated beneath the second portion 410 of the first further oxide layer. As before, the second portion 410 of the first further oxide layer is pushed upwards as the second portion 418 of the second further oxide layer is grown beneath it. Further, a third portion 420 of the second further oxide layer is fabricated on the substrate 404 adjacent the second portion 418 of the second further oxide layer.

The thickness of the third portion 420 of the second further oxide layer fabricated next to the second portion 418 of the second further oxide layer may be in the range from 25 Å to 35 Å, or preferably 32 Å.

The thickness of the combined furnace oxide layer portions 410 and 418 may be in the region between 55 Å and 65 Å, or preferably around 60 Å.

The fabrication of the first portion 416 of the second further gate oxide also pushes up the first oxide layer 402 and forms an oxide layer beneath the first oxide layer 402 and the first portion 408 of the first further oxide layer. The combined thickness of the stack of oxide layer portions 402, 408 and 416 is in the range from 65 Å to 80 Å, or preferably around 70 Å

The resulting structure is a fabricated oxide comprising three parts 412, 422, 424 each adjacent each other on the substrate 404. The first part 412 is a tunnel oxide comprising the first oxide layer 402 and the first portions 408, 416 of each of the first and second further oxide layers. Therefore, the first oxide layer 402, which was fabricated using an ISSG process, remains as the top layer of the tunnel oxide. The second part 422 is adjacent the tunnel oxide and comprises the second portions 410, 418 of each of the first and second further oxide layers. The third part 424 comprises the third portion 420 of the second further oxide layer.

The third part 420 of the second further oxide layer may be used for 1.8V gates. Combined first and second oxide layers 410 and 418, i.e. the second part 422, may be used for 3.3V gates. The stack of the three layers 402, 408 and 416, i.e. the first part 412, may be used as a thick oxide layer for the NVM.

The result of this three step process is a thicker final tunnel oxide stack 412 which can be used, for example, for UV-EPROM floating gate or select gate transistors.

Returning to FIG. 3, a gate poly-silicon is deposited 332 as the next step. Then, all the transistors in the NVM are defined 333 by a poly mask over the active region, and unwanted poly-silicon is etched 334 away by anisotropic etching. This is followed by various masking, lightly-doped drain implantation and cleaning steps 335. An L-shaped poly sidewall (spacer 105 of FIG. 1) is now formed 336, followed by source/drain implantations 337, salicidation and metallization using conventional semiconductor fabrication methods 338. The required optional SONOS transistors (SONOS Cell, Access Gate/Select Gate), I/O transistors and UV-EPROM Floating Gate/Select Gate transistors are now fabricated.

The fabrication of a memory TOx as disclosed herein may require an additional mask and very little additional thermal budget, such that it could be introduced in the core platform process of any technology node without causing a change of other primitive device characteristics.

An approach proposed by the inventors is to use a short time ISSG process in order to reduce the thermal budget influence of the method for fabrication. For example, the duration of the ISSG process may be in the range of 30 to 45 seconds. Alternatively, the time may be in the range of 35 to 40 seconds.

The ISSG process may grow the oxide at a temperature in the range from 900 to 1000 degrees Celsius, or preferably at a temperature of about 950 degrees Celsius.

The ISSG process may use an oxygen gas flow in the range of 4.9 and 5 slm (standard litres per minute, corresponding to the range of $8.18*10^{-5}$ m$^3$/s and $8.35*10^{-5}$ m$^3$/s), or alternatively around 4.95 slm ($8.26*10^{-5}$ m$^3$/s).

The ISSG process may use an H$_2$ gas flow in the range of 0.01 slm ($0.0167*10^{-5}$ m$^3$/s) and 0.1 slm ($0.167*10^{-5}$ m$^3$/s), or alternatively around 0.05 slm ($8.35*10^{-7}$ m$^3$/s).

The ISSG process may take place under a pressure between 9 and 10 Torr (1200 Pa and 1333 Pa), or alternatively under a pressure of about 9.5 Torr (1266 Pa).

The use of an ISSG process does not cause significant change in the charge or interface state density of the oxide. That is, the interface state density ($D_{it}$) across the band-gap and close to the conduction band edge does not significantly change in an ISSG grown oxide and there is therefore little or no deterioration of interface properties. In addition, the ISSG grown oxide is more conformable as compared with an oxide grown by thermal oxide and rapid thermal oxide methods.

The furnace oxidation may be a combination of dry oxidation at 800° C. for a period of 5 minutes, wet oxidation at 750° C. for a period of 23 minutes and annealing at 900° C. for a period of 5 minutes to grow a 32 Å gate oxide.

ISSG oxidation has been carried out by the inventors for testing purposes at low-pressure in an AMAT Centura cold-wall RTP reactor. The main characteristic of an ISSG process is the introduction of hydrogen and oxygen precursor gas into the RTP chamber without pre-combustion. The hot wafer has a temperature in the range of 900 to 1050° C. and acts as an ignition source at low pressure. Gases react in close proximity to the hot wafer and give primary species including steam, hydroxyl groups and highly reactive atomic oxygen radicals (O*).

The ISSG approach is preferred, because when compared with pure furnace oxidation, the ISSG approach has a lower field oxide loss due to HF dipping for the non-NVM area and the ISSG approach has a lower thermal budget. Using ISSG methods, it is possible to maintain the field step height profile of the oxide regions and, therefore, the characteristics of primitive devices, thereby simplifying integration of the invention with more primitive devices. Additionally, both the FG and SG of a UV-EPROM memory device could utilize the same gate oxide stack 412, which achieves a narrower FG and SG spacing for better cell area packing density.

It is possible to perform the integration without any SONOS cell formation, so without steps 312 to 316, steps 318 to 320 and step 327 in FIG. 3. If no SONOS cell formation is performed, the sacrificial thermal oxide layer may be grown in step 310 and stripped away instantly in step 311. This keeps an integrated thermal budget and allows process modularity in that the same processes may be used for SONOS and for other types of memory, e.g. UV-EPROM. The sacrificial oxide layer without SONOS cell formation is removed by wet clean, and the first oxide layer is formed with an ISSG process. The purpose of the sacrificial oxide layer for fabrication of non-SONOS devices is to maintain the process thermal budget, whereas in of the fabrication of SONOS devices it provides a screening oxide for deep N-well implantation, SONOS Cell implantation and SONOS cell V$_{th}$ implantation prior to its removal.

An advantage of embodiments of the present invention is that the NVM data retention characteristics can be improved for a single poly floating gate device for a high density UV-EPROM and EEPROM application. The MOSFET characteristics have been measured and the measurements are shown in FIGS. 6 to 13.

A further advantage is that no significant process modification is required of the established core primitive and that there is only a low thermal budget influence from rapid ISSG radical oxidation for the formation of dedicated TOx.

This thickened tunnel oxide approach using a low thermal budget ISSG Oxidation cell fabrication process is able to improve NVM cell data retention and offers enhanced essential reliability characteristics without jeopardizing established core primitive devices.

The process disclosed herein may replace a conventional pure single step furnace oxidation.

FIGS. 5 to 12 show the results of parametric tests and provide evidence that the process described herein will not have a significant thermal budget influence on the electrical characteristics of a device formed by the process. The data labelled "standard" shows results obtained with a conventional dual gate furnace oxide. The data labelled "Furnace 32 Å" shows results obtained when the ISSG layer according to processes disclosed herein is replaced by a 32 Å conventional thermal oxidation to achieve the same composite thickness as the oxides disclosed herein. The data labelled "ISSG . . . " shows results obtained for oxides disclosed herein and comprising ISSG layers grown for varying numbers of seconds (24 seconds, 35 seconds or 40 seconds). The plots in FIGS. 5 to 12 are cumulative plots showing the data distribution of a sample of oxide layers of the stated type, according to the legend. The y-axes show the cumulative percentage of the whole sample population distribution and allow interpretation of the mean, max, min and outliers when viewing the plot.

Figure 5A:
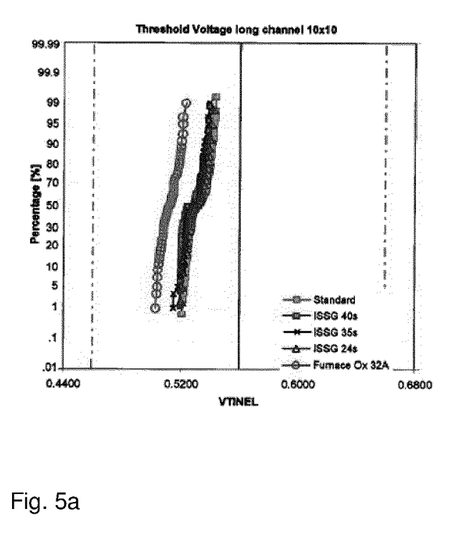
FIG. 5a shows the threshold voltage distribution of different oxide layers.
Figure 5B:
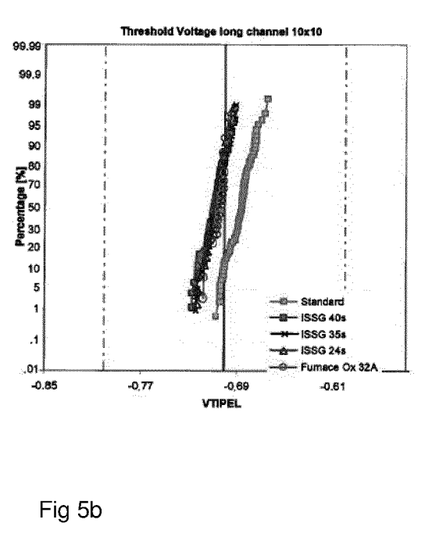
FIG. 5b shows the threshold voltage distribution of different oxide layers.

FIGS. 5a and 5b show the threshold voltage distribution of the different oxide layers. In FIG. 5a, VTINEL relates to the long channel 10μ×10μ threshold voltage for a 1.8V NMOS device. In FIG. 5b, VTIPEL relates to the long channel 10μ×10μ threshold voltage for a 1.8V PMOS device.

Figure 6:
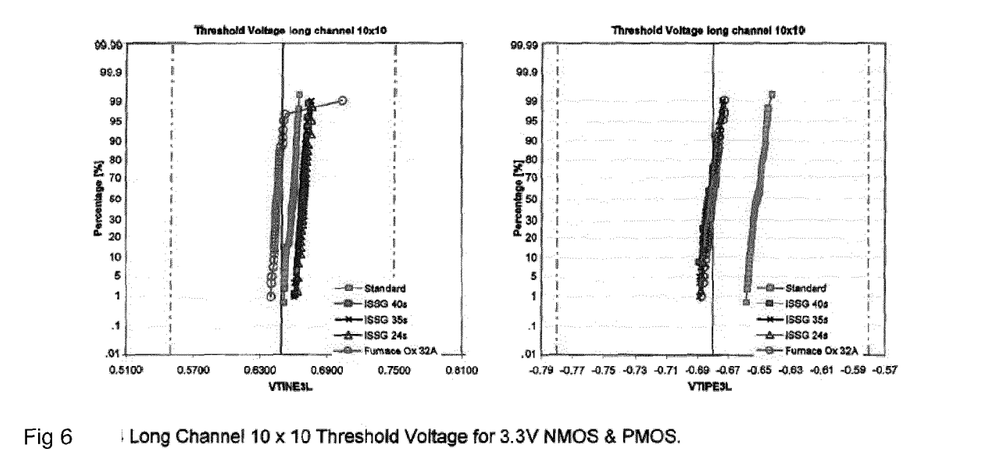
FIG. 6 shows the threshold voltage distribution of different oxide layers.

FIG. 6 shows the threshold voltage distribution of different the oxide layers. In FIG. 6, VTINE3L relates to the long channel 10μ×10μ threshold voltage for a 3.3V NMOS device, and VTIPE3L relates to the long channel 10μ×10μ threshold voltage for a 3.3V PMOS device.

Figure 7:
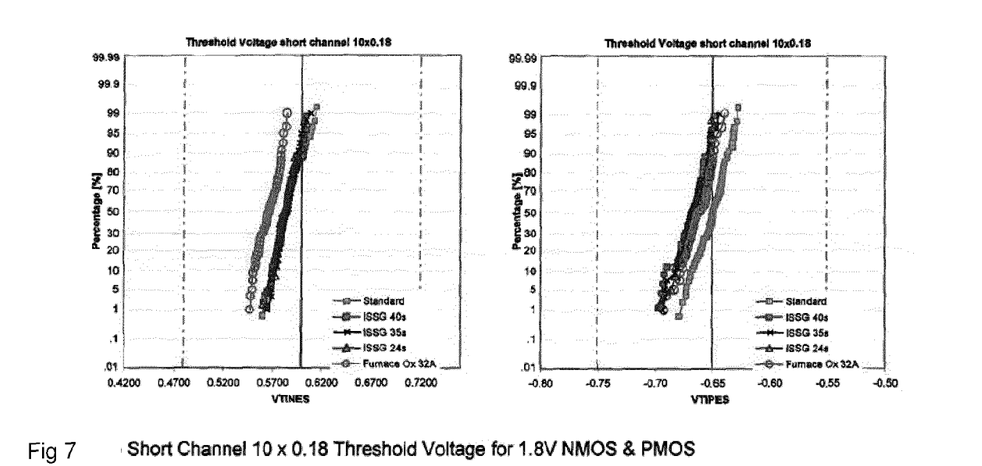
FIG. 7 shows the threshold voltage distribution of different oxide layers.

FIG. 7 shows the threshold voltage distribution of the different oxide layers. In FIG. 7, VTINES relates to the short channel 10μ×0.18μ threshold voltage for a 1.8V NMOS device, and VTIPES relates to the short channel 10μ×0.18μ threshold voltage for a 1.8V PMOS device.

Figure 8:
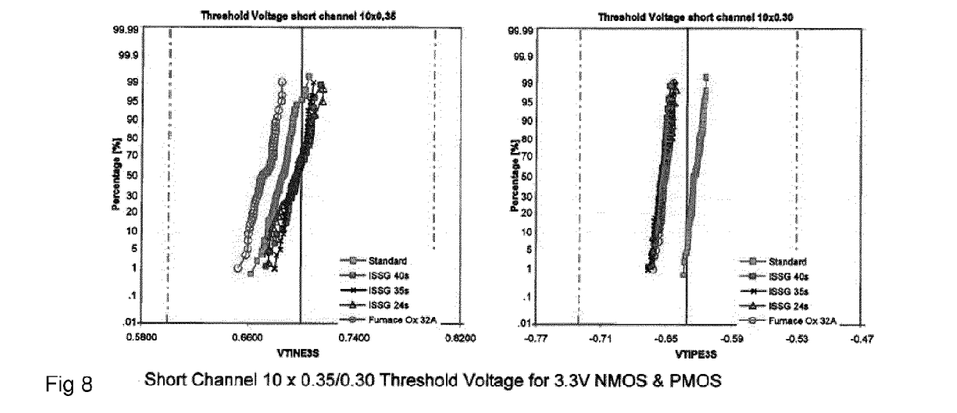
FIG. 8 shows the threshold voltage distribution of different oxide layers.

FIG. 8 shows the threshold voltage distribution of the different oxide layers. In FIG. 8, VTINE3S relates to the short channel 10μ×0.35/0.3μ threshold voltage for a 3.3V NMOS device, and VTIPE3S relates to the short channel 10μ×0.35/0.3μ threshold voltage for a 3.3V PMOS device.

Figure 9:
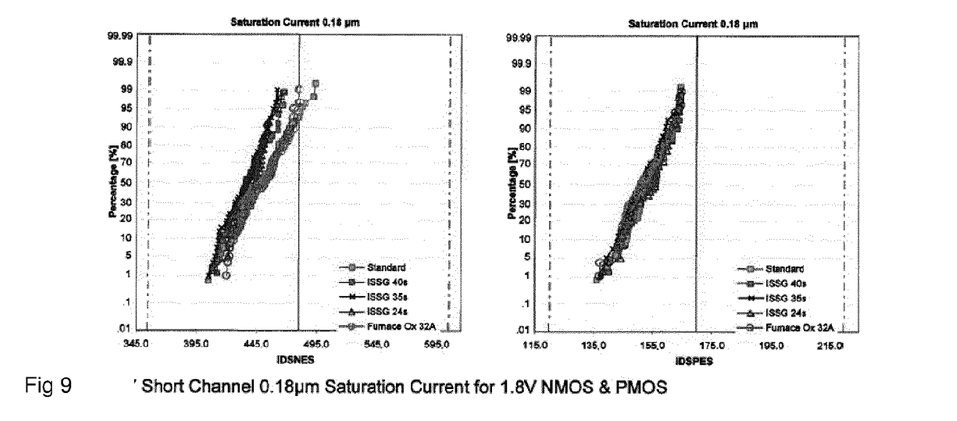
FIG. 9 shows the saturation current distribution of different oxide layers.

FIG. 9 shows the saturation current distribution of the different oxide layers. In FIG. 9, IDSNES relates to the short channel 0.18μ threshold voltage for a 1.8V NMOS device, and IDSPES relates to the short channel 0.18μ threshold voltage for a 1.8V PMOS device.

Figure 10:
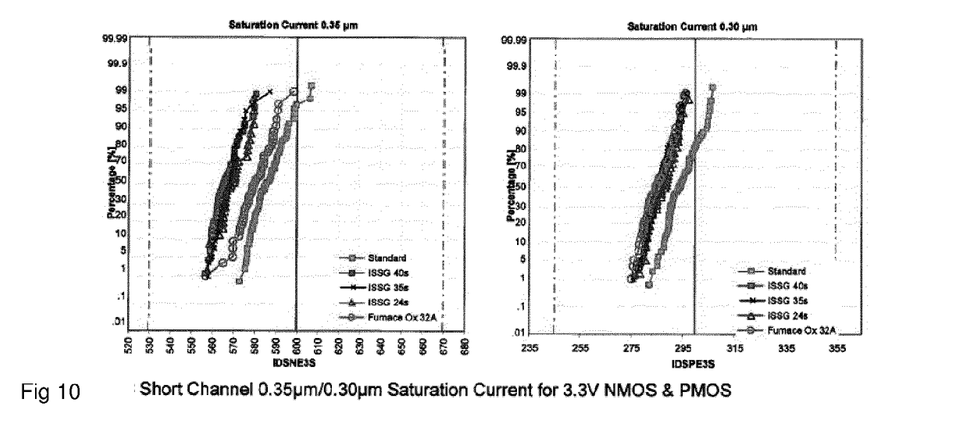
FIG. 10 shows the saturation current distribution of different oxide layers.

FIG. 10 shows the saturation current distribution of the different oxide layers. In FIG. 10, IDSNE3S relates to the short channel 0.35/0.3μ saturation current for a 3.3V NMOS device, and IDSPE3S relates to the short channel 0.35/0.3μ saturation current for a 3.3V PMOS device.

Figure 11:
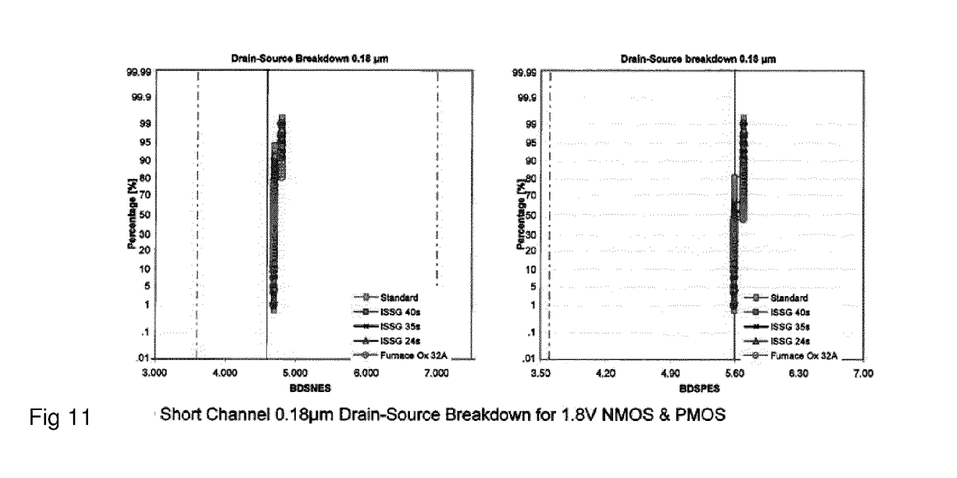
FIG. 11 shows the drain-source breakdown distribution of different oxide layers.

FIG. 11 shows the drain-source breakdown distribution of the different oxide layers. In FIG. 11, BDSNES relates to the short channel 0.18μ drain-source breakdown for a 1.8V NMOS device, and BDSPES relates to the short channel 0.18μ drain-source breakdown for a 1.8V PMOS device.

Figure 12:
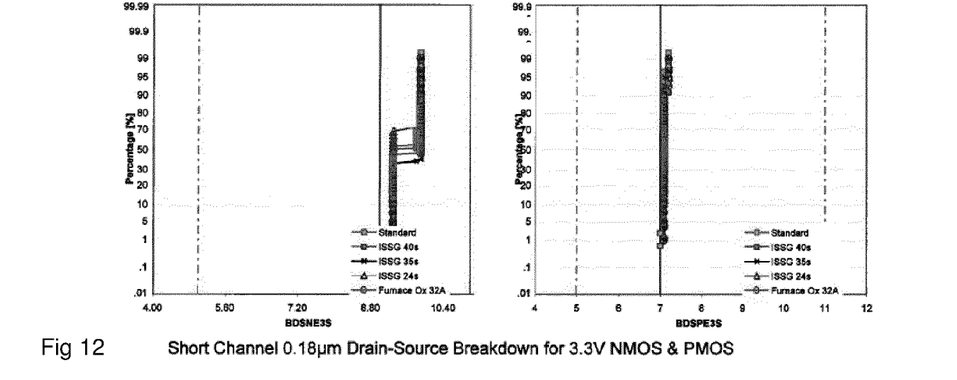
FIG. 12 shows the drain-source breakdown distribution of different oxide layers.

FIG. 12 shows the drain-source breakdown distribution of the different oxide layers. In FIG. 12, BDSNE3S relates to the short channel 0.18μ drain-source breakdown for a 3.3V NMOS device, and BDSPE3S relates to the short channel 0.18μ drain-source breakdown for a 3.3V PMOS device.

In the general case, the acronyms used in FIGS. 5 to 12 may be determined by the following: VTI relates to threshold voltage; NE relates to NMOS; PE relates to PMOS; L relates to 1.8V 10μ×10μ Long Channel; 3L relates to 3.3V 10μ×10μ Long Channel; S relates to 1.8V 10μ×0.18μ Short Channel; 3S relates to 3.3V 10μ×0.35μ/0.3μ Short Channel; IDS relates to saturation current; and BDS relates to drain-source breakdown.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A method of fabricating a tunnel oxide layer for a semiconductor memory device, the method comprising:
    fabricating on a substrate a first oxide layer by an in-situ-steam-generation process; and
    fabricating at least one further oxide layer by a furnace oxidation process,
    wherein during fabrication of the at least one further oxide layer, reactive gases penetrate the first oxide layer and react with the silicon substrate to form at least a first portion of the at least one further oxide layer beneath the first oxide layer.

2. The method of claim 1, wherein fabricating the first oxide layer results in the first oxide layer having a thickness in the range from 25 Å to 35 Å.

3. The method of claim 1, wherein the duration of the in-situ-steam-generation process is in the range from 30 seconds to 45 seconds.

4. The method of claim 1, wherein the duration of the in-situ-steam-generation process is in the range from 35 seconds to 40 seconds.

5. The method of claim 1, wherein the temperature of the in-situ-steam-generation process is in the range from 900 degrees Celsius to 1000 degrees Celsius.

6. The method of claim 1, wherein a second portion of the at least one further oxide layer is fabricated adjacent to the first oxide layer.

7. The method of claim 6, wherein the thickness of the second portion of the at least one further oxide layer fabricated next to the first oxide layer is in the range from 25 Å to 35 Å.

8. The method of claim 1, wherein the in-situ-steam-generation process uses an oxygen gas flow in the range from $8.18*10^{-5}$ m$^3$/s to $8.35*10^{-5}$ m$^3$/s per silicon wafer.

9. The method of claim 1, wherein the in-situ-steam-generation process uses a hydrogen gas flow in the range from $0.0167*10^{-5}$ m$^3$/s to $0.167*10^{-5}$ m$^3$/s per silicon wafer.

10. The method of claim 1, wherein the pressure applied during the in-situ-steam-generation process is in the range from 1200 Pa to 1333 Pa.

11. A method according to claim 1, wherein a second portion of the at least one further oxide layer is fabricated on the substrate adjacent to the first oxide layer.

12. The method of claim 1, wherein fabricating the at least one further oxide layer comprises fabricating first and second further oxide layers, each fabricated by a furnace oxidation process, wherein a first portion of the second further oxide layer is formed beneath the first oxide layer.

13. The method of claim 12, wherein the combined thickness of the first oxide layer and first and second further oxide layers is in the range from 68 Å to 80 Å.

14. A method according to claim 12, wherein a second portion of the second further oxide layer is formed beneath a second portion of the first further oxide layer fabricated adjacent to the first oxide layer, wherein during fabrication of the second portion of the second further oxide layer, reactive gases penetrate the second portion of the first further oxide layer and react with the silicon substrate to form the second portion of the second further oxide layer beneath the second portion of the first further oxide layer.

15. A method according to of claim 14, wherein a third portion of the second further oxide layer is formed on the substrate adjacent to the second portion of the second further oxide layer.

16. The method of claim 12, further comprising, after the fabrication of said first oxide layer and first further oxide layer and before the fabrication of said second further oxide layer:

covering at least a portion of the first oxide layer and a portion of the first further oxide layer with a mask;

wet cleaning to remove from the substrate the portion of the first oxide layer and/or first further oxide layer not covered by the mask; and removing the mask.

17. The method of claim 1, wherein said first, and at least one further oxide layers are formed without use of plasma nitridation.

18. The method of claim 1, wherein the semiconductor memory device is a single poly floating gate erasable programmable read only memory.

19. The method of claim 1, wherein the semiconductor memory device is a single poly floating gate electrically erasable programmable read-only memory.

20. A tunnel oxide layer for a semiconductor memory device manufactured by:

fabricating on a substrate a first oxide layer by an in-situ-steam-generation process; and fabricating at least one further oxide layer by a furnace oxidation process, wherein during fabrication of the at least one further oxide layer, reactive gases penetrate the first oxide layer and react with the silicon substrate to form at least a first portion of the at least one further oxide layer beneath the first oxide layer.

21. A semiconductor device comprising a tunnel oxide layer manufactured by:

fabricating on a substrate a first oxide layer by an in-situ-steam-generation process; and fabricating at least one further oxide layer by a furnace oxidation process, wherein during fabrication of the at least one further oxide layer, reactive gases penetrate the first oxide layer and react with the silicon substrate to form at least a first portion of the at least one further oxide layer beneath the first oxide layer.

22. A tunnel oxide layer for a semiconductor memory device comprising an in situ-steam generation (ISSG) oxide layer positioned on top of at least one furnace oxidation oxide layer, wherein the ISSG oxide layer and the at least one furnace oxidation oxide layer are stacked.

* * * * *